United States Patent
Alton et al.

(10) Patent No.: US 6,728,651 B1
(45) Date of Patent: Apr. 27, 2004

(54) METHODS AND APPARATUSES FOR DIGITALLY TUNING A PHASED-LOCK LOOP CIRCUIT

(75) Inventors: Tim Alton, San Jose, CA (US); Wai-Kong Chen, Fremont, CA (US); Michael Davis, San Jose, CA (US); Warren Necoechea, Fremont, CA (US)

(73) Assignee: LTX Corporation, Westwood, MA (US)

( * ) Notice: Subject to any disclaimer, the term of this patent is extended or adjusted under 35 U.S.C. 154(b) by 109 days.

(21) Appl. No.: 10/097,904

(22) Filed: Mar. 13, 2002

(51) Int. Cl.[7] .............................................. G06F 19/00
(52) U.S. Cl. ...................................................... 702/107
(58) Field of Search ......................................... 702/107

(56) References Cited

U.S. PATENT DOCUMENTS

| | | | | |
|---|---|---|---|---|
| 4,751,565 A | * | 6/1988 | Emmons et al. ............ | 348/539 |
| 5,424,688 A | * | 6/1995 | Phillips ........................ | 331/16 |
| 5,577,086 A | * | 11/1996 | Fujimoto et al. ........... | 375/376 |
| 6,157,271 A | * | 12/2000 | Black et al. ................ | 332/127 |

\* cited by examiner

*Primary Examiner*—John Barlow
*Assistant Examiner*—Anthony T Dougherty
(74) *Attorney, Agent, or Firm*—Blakely, Sokoloff, Taylor & Zafman LLP

(57) ABSTRACT

A phase-locked loop circuit having a programmable tuning voltage. As the input reference clock frequency is changed, the tuning voltage is changed accordingly to compensate for the propagation delay through the phase detector and thereby reduce discrepancies in the phase relationship between the input reference clock signal and the output clock signal at different frequencies. A set of compensation values corresponding to input reference clock frequencies are stored in a memory device. When the input reference clock frequency is changed, a corresponding compensation value is programmed to a digital-to-analog converter (DAC). The DAC outputs a voltage that is proportional to the value of the digital input to the DAC and can thus be used to regulate the tuning voltage of the PLL circuit so that the relationship of the input reference clock signal to the output clock signal remains stable with frequency changes.

24 Claims, 3 Drawing Sheets

METHODS AND APPARATUSES FOR DIGITALLY TUNING A PHASED-LOCK LOOP CIRCUIT

FIELD OF THE INVENTION

The present invention relates generally to phase-locked loop (PLL) circuits. More particularly, the present invention relates to methods and circuitry for compensating for propagation delay through the phase comparator of a PLL circuit.

BACKGROUND OF THE INVENTION

PLL circuits are a type of control loop that controls the phase of a number of signals. PLL circuits are implemented in a wide variety of electronic devices including electronic test equipment. The basic design and characteristics of PLL circuits are well established and known in the art.

FIG. 1 shows a block diagram of a typical PLL circuit in accordance with the prior art. The PLL circuit 100, shown in FIG. 1, includes four basic components: a phase comparator (phase detector) 105, a loop filter 110, a voltage controlled oscillator (VCO) 115, and a clock divider (frequency divider) 120. The components are connected in a feedback configuration as shown in FIG. 1. The phase detector 105 compares the phase of the input reference clock signal 102 with the phase of the feedback VCO signal 108 and provides a DC output signal 103 proportional to the phase difference of the two signals. The VCO circuit generates a frequency proportional to its input voltage. The output voltage of the phase detector 105 is used to adjust the VCO 115 until the difference in phase between the two signals is very small.

However, as the frequency of the input reference clock signal 102 changes, the propagation delay through the phase detector 105 changes. This changes the phase relationship between the input reference clock signal 102 and the output clock signal 107. The propagation delay may only be on the order of tens of picoseconds (ps), but this may have significant detrimental effect in applications requiring highly accurate timing such as electronic test equipment.

Moreover, the change in propagation delay as a function of frequency is not the same from one PLL circuit chip to the next. In applications employing multiple PLL circuits and variable frequencies (e.g., electronic test equipment), the change in propagation delay may have a serious detrimental effect on the timing calibration.

It is possible to compensate for the propagation delay through the phase detector by adjusting a tuning voltage to tune the VCO circuit. As shown in FIG. 1, the phase detector output signal 103 is summed with signal 104 at a current summing node. By varying the resistance tied to the tuning voltage, the current of signal 104 can be changed. Typically, each VCO is connected to an oscilloscope and resistance values are substituted to tune the reference voltage until the phase difference between the input reference clock signal and the output clock signal is near zero. This is a costly and time consuming process and is imprecise as it is dependent upon ambient conditions and subject to operator error.

Phase detectors that are less sensitive to frequency variation could be developed, but because the variation of propagation delay with frequency is relevant in only a small number of applications, there is no pressure on manufacturers to produce a less sensitive PLL circuit chip.

Additionally, as typical clock frequencies continue to rise there will be a corresponding rise in the accuracy required of the PLL circuit. At higher frequencies the PLL circuit will be more sensitive to the errors caused by the phase detector propagation delay. This will make conventional tuning methods more complex and costly while manufacturers will be less likely to pursue the ideal PLL circuit chip.

SUMMARY OF THE INVENTION

A digitally tunable phase-locked loop (PLL) circuit is described. A progammable digital-to-analog converter (DAC) is coupled to the PLL circuit such that the output voltage of the DAC may be used as a tuning voltage for the PLL circuit.

Other features and advantage of the present invention will be apparent from the accompanying drawings and from the detailed description, that follows below.

BRIEF DESCRIPTION OF THE DRAWINGS

The present invention is illustrated by way of example, and not limitation, by the figures of the accompanying drawings in which like references indicate similar elements and in which.

DETAILED DESCRIPTION

A PLL circuit is described having a programmable tuning voltage. As the reference clock frequency is changed, the tuning voltage is changed accordingly to compensate for the propagation delay through the phase detector, thereby reducing discrepancies in the phase relationship between the input reference clock signal and the output clock signal.

One embodiment includes a field programmable gate array (FPGA) coupling a non-volatile memory device to the DAC. A set of compensation values is stored within the non-volatile memory. Each compensation value corresponds to a range of PLL reference clock input frequencies. The FPGA reads the input frequency of the PLL circuit and automatically retrieves a compensation value corresponding to the input frequency from a non-volatile memory to the FPGA's internal memory. The FPGA then programs the DAC with this value. The DAC may be programmed to output a voltage that is proportional to the value of a digital input to the DAC. The DAC may be programmable by means of a shift register controlled by a processor element. The DAC may thus be used to regulate the tuning voltage of the PLL circuit so that the relationship of the input reference clock signal to the output clock signal remains stable with frequency changes.

An intended advantage of one embodiment of the present invention is to reduce the change in the phase relationship between a PLL reference clock signal and output signal over the frequency range of the reference clock. Another intended advantage of one embodiment of the present invention is to provide a means for automatically tuning a VCO of a PLL circuit. Another intended advantage of one embodiment is to provide a means to tune a VCO of a PLL circuit in-place. Another intended advantage of one embodiment is to reduce timing errors in a system containing multiple PLL circuits.

Figure 1:
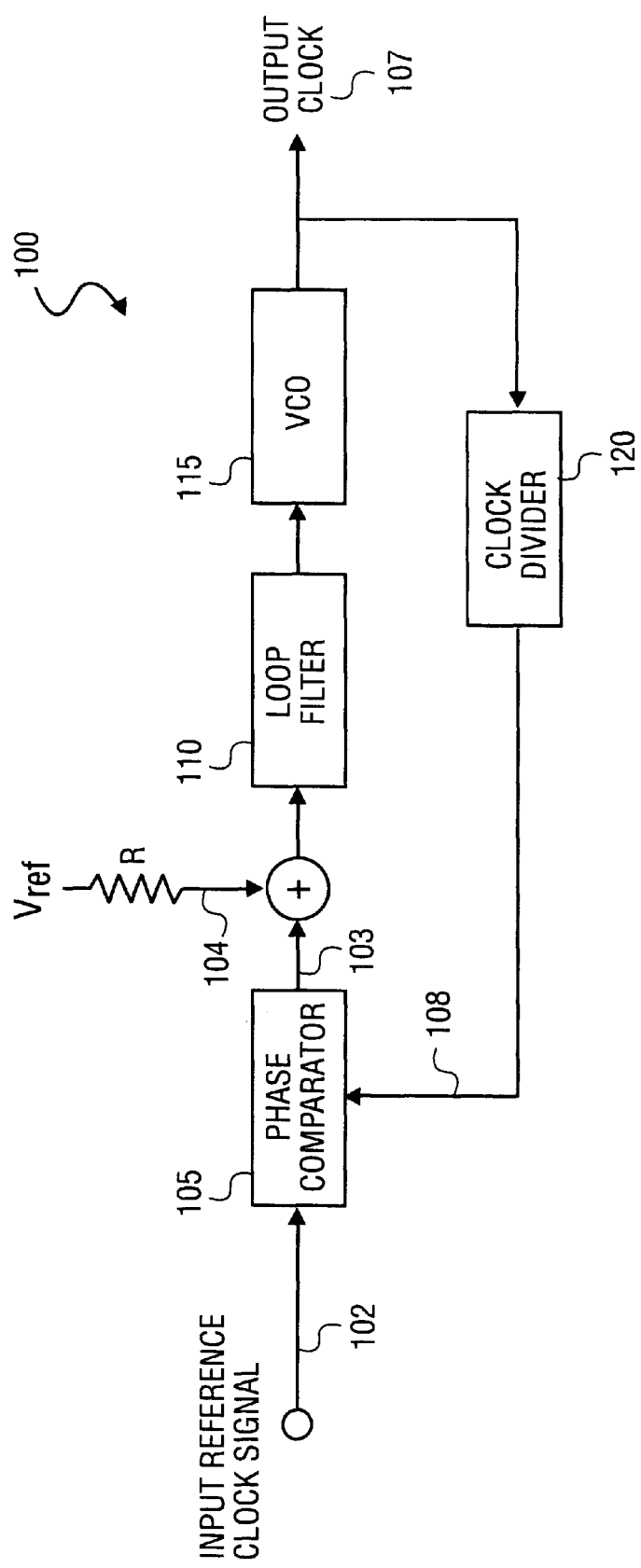
FIG. 1 shows a block diagram of a typical PLL circuit in accordance with the prior art.
Figure 2:
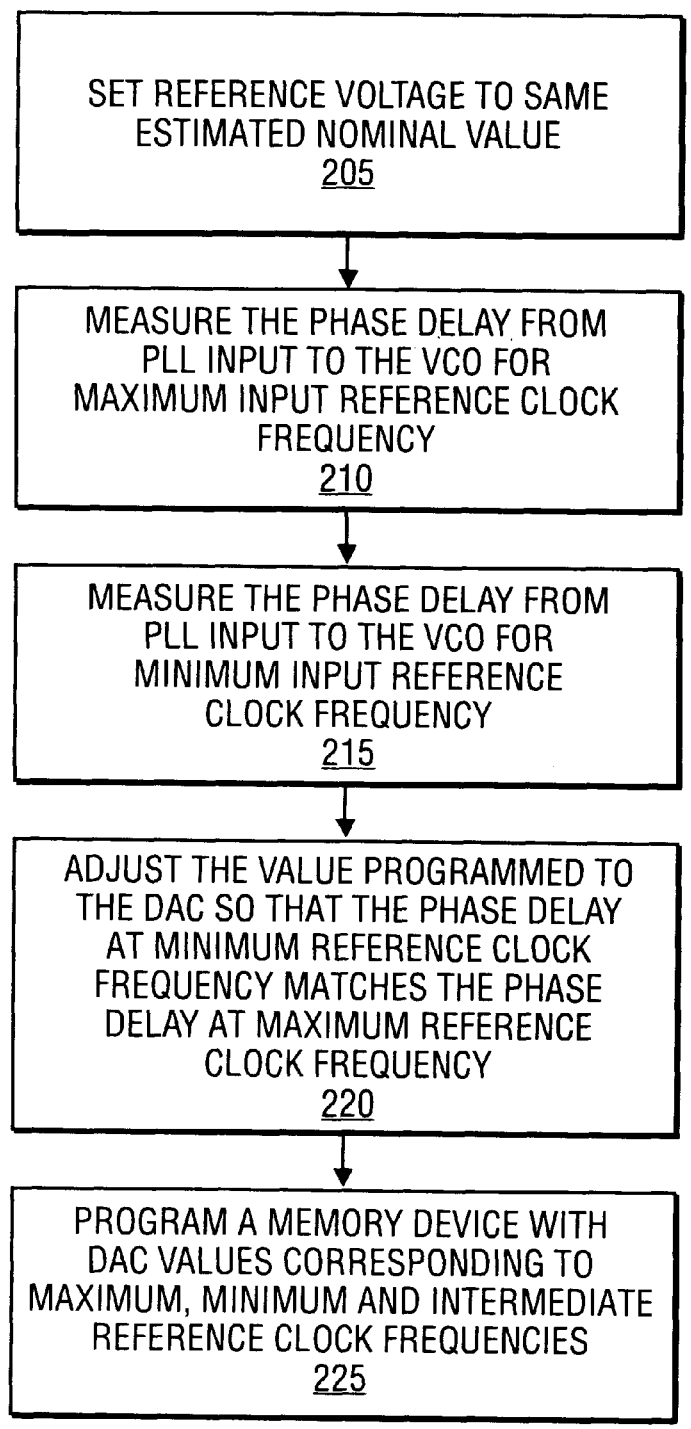
FIG. 2 is a process flow diagram in accordance with one embodiment of the present invention.

FIG. 2 is a process flow diagram in accordance with one embodiment of the present invention. Process 200, shown in FIG. 2, begins with operation 205 in which the reference voltage is set to some nominal estimated value. At operation 210 the phase delay from the input of the PLL circuit to the VCO is measured with the input reference clock at maximum frequency. At this point the DAC is programmed with some initial value. The Programmable DAC may contain a number of binary weighted current sources that can be programmed in value by using fuses. In an alternative embodiment the current sources may be programmed by using a processor controlled shift register circuit to set a desired frequency. At operation 215 the phase delay is measured with the input reference clock at a minimum frequency. At operation 220 the value programmed to the DAC is adjusted so that the phase delay at the minimum frequency matches the phase delay at the maximum frequency. That is the DAC is adjusted so that the phase delays at each frequency match to within a specified tolerance. For one embodiment, the phase delays are matched to within 10 picoseconds. The change in the input value of the DAC, required for an equal phase delay at maximum and minimum input clock frequencies, is then used to program a memory device at operation 225. The first memory location is programmed with a DAC value corresponding to the maximum input clock frequency and the last memory location is programmed with a DAC value corresponding to the minimum input clock frequency. Intermediate memory locations are programmed with DAC values corresponding to intermediate frequencies.

For one embodiment, the DAC values stored to the intermediate locations represent a linear interpolation between the DAC value corresponding to the maximum input clock frequency—stored in the first memory location—and the DAC value corresponding to the minimum input clock frequency which is stored in the last memory location. For alternative embodiments, the appropriate DAC values may be determined for several frequencies and a suitable interpolation is employed to program the memory device. For example, a linear interpolation may yield an acceptable error at current typical frequencies. For higher clock frequencies, requiring a significantly reduced error, a different mathematical relationship may be used to estimate the intermediate DAC values (e.g., $2^{rd}$ order polynomial interpolation).

Alternatively, DAC values may be determined for a number of frequencies corresponding to the number of memory locations with no need for interpolated values.

In a system containing multiple PLL circuits, a set of compensation values for each PLL circuit may be determined as described above for one embodiment. This may be necessary as the propagation delay through the phase detector of a PLL circuit may differ from one chip to the next. However, for some applications and some PLL circuit chips, the difference in propagation delay through the phase detector of each PLL circuit within a system may not be significant. In such cases a set of compensation values may be determined for one PLL circuit and then used for all PLL circuits within a system. Alternatively, a set of compensation values may be determined for several PLL circuits, and an average of theses values may be implemented for all PLL circuits within a system.

Figure 3:
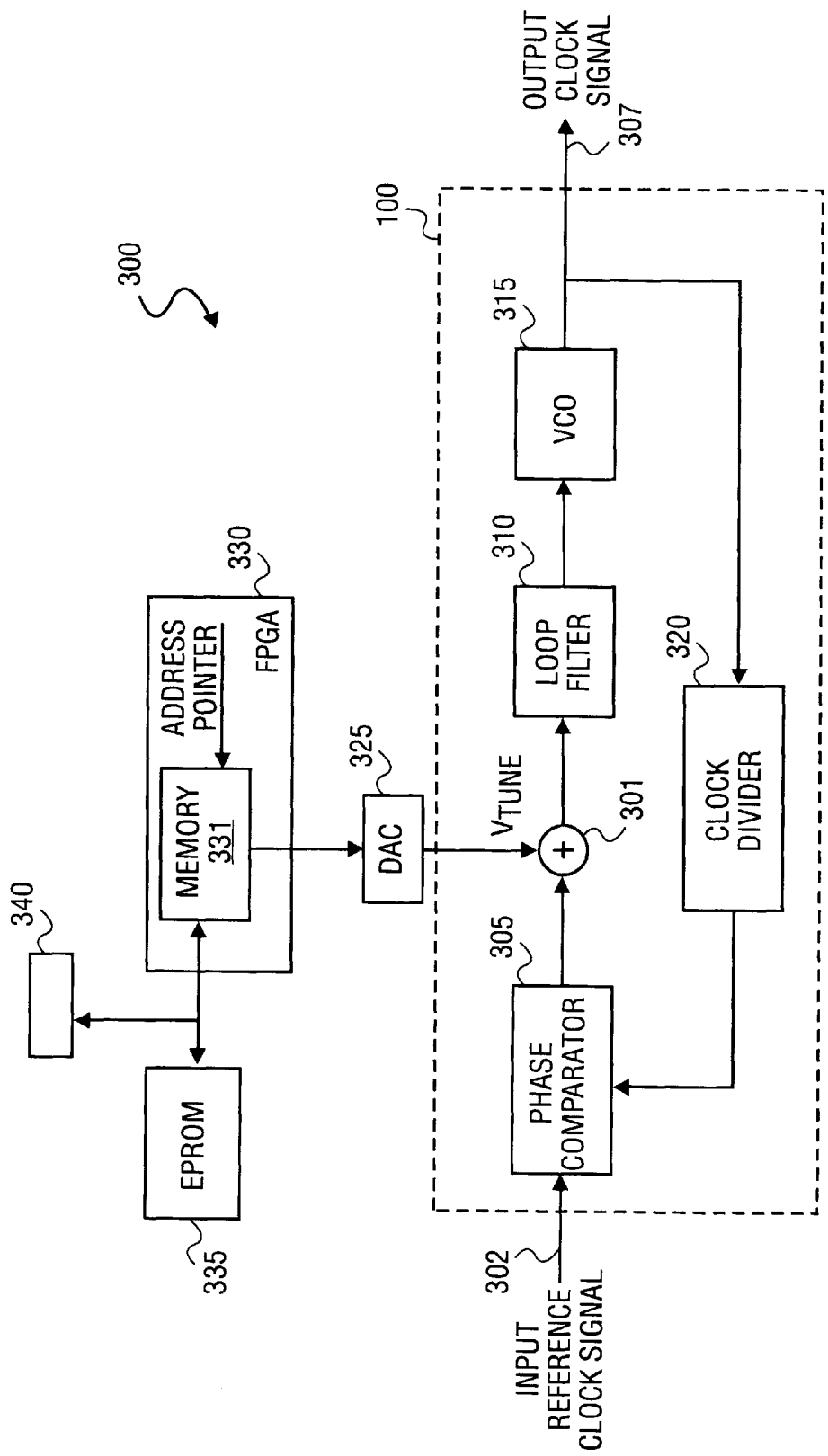
FIG. 3 is block diagram of a PLL circuit having a DAC-controlled tuning voltage in accordance with one embodiment of the present invention.

FIG. 3 is block diagram of a PLL circuit having a DAC-controlled tuning voltage in accordance with one embodiment of the present invention. The system 300 shown in FIG. 3 includes PLL circuit 100 with PLL circuit components: phase detector 305, loop filter 310, VCO 315, and clock divider 320. In accordance with one embodiment of the present invention, a DAC 325 is used to digitally adjust the tuning voltage. The programmed value of the DAC 325 determines the current coming into the current summing node 301.

The DAC 325 is coupled through the field programmable gate array (FPGA) 330 to a non-volatile memory device 335. The non-volatile memory device 335 may be an EPROM for example. As discussed above, in reference to FIG. 2, the non-volatile memory device contains a set of compensation values corresponding to a range of frequencies. When the frequency of the input reference clock signal 302 is set, an address pointer is written to the FPGA memory 331. The FPGA 330 is used to access the compensation values stored in non-volatile memory 335 and then write them to the DAC 325. On power up, the FPGA 330 automatically fetches the compensation value corresponding to the input reference clock frequency from the non-volatile memory device 335. Every time the input reference clock is reprogrammed to a new frequency, a value representing that frequency is written to the memory pointer in the FPGA. The compensation value in that memory location is then programmed to the DAC 325. Thus, whenever the frequency of the input reference clock signal 302 is changed, a new compensation value is loaded into the DAC 325. The input value to the DAC 325 results in a corresponding output voltage. The output voltage from the DAC 325 is used to adjust the tuning voltage of the PLL, thereby reducing the change in the phase relationship between the input reference clock signal 302 and the output clock signal 307 as the frequency of the input reference clock signal changes. An embodiment of the present invention thus provides the ability to compensate for the propagation delay of a PLL using an external digital source.

For one embodiment, the VCO 315, DAC 325, and EPROM 335 are implemented on a single printed circuit board. Such an arrangement reduces the line length between the DAC and the summing node 301, thereby reducing potential noise from this source.

System 300 may also include a connector 340 through which the FPGA may be programmed or reprogrammed. Alternative compensation values may be written to FPGA memory 331 and then transferred to non-volatile memory 335. This reduces the cost and effort required to reprogram a PLL circuit in-place. In a system having multiple PLL circuit boards savings may be substantial as all of the boards may be reprogrammed without being removed from the system.

For one embodiment, the operation of storing compensation values in memory, accessing stored compensation values, and/or the operation of loading the compensation value into the DAC may be implemented by hardware and/or software contained within the system. For example, the system may include one or more processors that can execute code or instructions stored within a machine-readable medium that may also be included within the system.

The machine-readable medium may include a mechanism that provides (i.e., stores and/or transmits) information in a form readable by a machine such as computer or digital processing device. For example, a machine-readable medium may include a read only memory (ROM), random access memory (RAM), magnetic disk storage media, optical storage media, flash memory devices. The code or instructions may be represented by carrier-wave signals, infrared signals, digital signals, and by other like signals.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:

measuring a phase delay of a PLL circuit at a first frequency, the PLL circuit having a digital-to-analog converter (DAC) to control a tuning voltage, the DAC programmed with a first value;

measuring a phase delay of a PLL circuit at a second frequency; and programming the DAC with a second value, the second value chosen such that the phase delay of the PLL circuit at the second frequency, with the DAC programmed with the second value, matches the phase delay of the PLL circuit at the first frequency, with the DAC programmed with the first value, to within a desired tolerance.

2. The method of claim 1, wherein the first frequency is an estimated maximum operating frequency of the PLL circuit and the second frequency is an estimated minimum operating frequency of the PLL circuit.

3. The method of claim 1 further comprising:

creating a set of compensation values, the set of compensation values starting with the first value corresponding to the first PLL circuit frequency, ending with the second value corresponding to the second PLL circuit frequency, and having a plurality of intermediate values each intermediate value corresponding to a PLL circuit frequency between the first PLL circuit frequency and the second PLL circuit frequency, such that programming the DAC with a compensation value will cause the phase delay of the PLL circuit at the corresponding frequency to match the phase delay of the PLL circuit at the first frequency with the DAC programmed with the first value, to within a desired tolerance.

4. The method of claim 3, wherein the desired tolerance is 10 picoseconds.

5. The method of claim 3, wherein the intermediate compensation values are determined through linear interpolation between the first value and the second value.

6. A machine-readable medium containing instructions which, when executed by a processor, cause the processor to perform a method, the method comprising:

measuring a phase delay of a PLL circuit at a first frequency, the PLL circuit having a digital-to-analog converter (DAC) to control a tuning voltage, the DAC programmed with a first value;

measuring a phase delay of a PLL circuit at a second frequency; and programming the DAC with a second value, the second value chosen such that the phase delay of the PLL circuit at the second frequency, with the DAC programmed with the second value, matches the phase delay of the PLL circuit at the first frequency, with the DAC programmed with the first value, to within a desired tolerance.

7. The machine-readable medium of claim 6, wherein the first frequency is an estimated maximum operating frequency of the PLL circuit and the second frequency is an estimated minimum operating frequency of the PLL circuit.

8. The machine-readable medium of claim 6, wherein the method further comprises:

creating a set of compensation values, the set of compensation values starting with the first value corresponding to the first PLL circuit frequency, ending with the second value corresponding to the second PLL circuit frequency, and having a plurality of intermediate values each intermediate value corresponding to an PLL circuit frequency between the first PLL circuit frequency and the second PLL circuit frequency, such that programming the DAC with a compensation value will cause the phase delay of the PLL circuit at the corresponding frequency to match the phase delay of the PLL circuit at the first frequency with the DAC programmed with the first value, to within a desired tolerance.

9. The machine-readable medium of claim 8, wherein the desired tolerance is 10 picoseconds.

10. The machine-readable medium of claim 8, wherein the intermediate compensation values are determined through linear interpolation between the first value and the second value.

11. An apparatus comprising:

a phase-locked loop (PLL) circuit;

a digital-to-analog converter (DAC) coupled to the PLL circuit such that an output voltage of the DAC may be used as a tuning voltage for the PLL circuit;

a non-volatile memory device having stored therein a set of compensation values, each compensation value corresponding to a range of PLL reference clock input frequencies; and circuitry coupling the non-volatile memory to the DAC, the circuitry having an internal memory, the circuitry performing the operations of a) reading an input frequency of the PLL circuit, b) automatically retrieving the corresponding compensation value from the non-volatile memory to the internal memory, and c) programming the DAC with the corresponding compensation value.

12. The apparatus of claim 11, wherein the circuitry is a field programmable gate array (FPGA).

13. The apparatus of claim 11, wherein the PLL circuit, the DAC, the non-volatile memory device, and the CIRCUITRY are implemented on a single printed circuit board.

14. The apparatus of claim 11, wherein the compensation values are determined by a) measuring a phase delay of the PLL circuit at a maximum input frequency with the DAC programmed with a first compensation value, b) measuring a phase delay of the PLL circuit at a minimum input frequency, c) determining a last compensation value such that the phase delay of the PLL circuit at the minimum input frequency with the DAC programmed with the last compensation value matches the phase delay of the PLL circuit at the maximum input frequency with the DAC programmed with the first compensation value, to within a desired tolerance, and d) assigning compensation values between the first compensation value and the last compensation value to a plurality of input frequency ranges between the maximum frequency and the minimum frequency.

15. The apparatus of claim 14, wherein the compensation values between the first compensation value and the last compensation value are determined through a linear interpolation.

16. The apparatus of claim 14, wherein the desired tolerance is 10 picoseconds.

17. An electronic test system including:

a plurality of phased-lock loop (PLL) circuits, each of the plurality of PLL circuits having a digital-to-analog circuit (DAC) coupled thereto such that the output voltage of the DAC may be used as a tuning voltage for the PLL circuit;

a non-volatile memory device, the non-volatile memory device having stored therein a set of compensation values, each compensation value corresponding to a range of PLL reference clock input frequencies; and circuitry coupling the non-volatile memory to the DAC, the circuitry having an internal memory, the circuitry performing the operations of a) reading an input frequency of the PLL circuit, b) automatically retrieving the corresponding compensation value from the non-volatile memory to the internal memory, and c) programming the DAC with the corresponding compensation value.

18. The system of claim 17, wherein the circuitry is a field programmable gate array (FPGA).

19. The system of claim 17, wherein the compensation values are determined by a) measuring a phase delay of the plurality of PLL circuits at a maximum input frequency with the DAC programmed with a first compensation value, b) measuring a phase delay of the PLL circuit at a minimum input frequency, c) determining a last compensation value such that the phase delay of the PLL circuit at the minimum input frequency with the DAC programmed with the last compensation value matches the phase delay of the PLL circuit at the maximum input frequency with the DAC programmed with the first compensation value, to within a desired tolerance, and d) assigning compensation values between the first compensation value and the last compensation value to a plurality of input frequency ranges between the maximum frequency and the minimum frequency.

20. The system of claim 19, wherein the compensation values between the first compensation value and the last compensation value are determined through a linear interpolation.

21. The system of claim 19, wherein the compensation values determined for one of the plurality of PLL circuits are used for all of the plurality of PLL circuits.

22. The system of claim 19, wherein a) compensation values are determined for several of the plurality of PLL circuits, b) the determined compensation values are averaged, and c) the average of the determined compensation values is used as the compensation values for all of the plurality of PLL circuits.

23. The system of claim 19, wherein the desired tolerance is 10 picoseconds.

24. The system of claim 19, wherein at least one of the plurality of PLL circuits resides on a printed circuit board together with a DAC, a non-volatile memory device, and a FPGA.

* * * * *